(12) United States Patent
Bae et al.

(10) Patent No.: US 12,625,436 B2
(45) Date of Patent: May 12, 2026

(54) LITHOGRAPHY APPARATUS

(71) Applicant: Samsung Electronics Co., Ltd.,
Suwon-si (KR)

(72) Inventors: Sung Yong Bae, Suwon-si (KR);
Hyeon Jin Kim, Suwon-si (KR);
Jeong-Gil Kim, Suwon-si (KR);
Kyoung Hwan Oh, Suwon-si (KR);
Dong Jin Lee, Suwon-si (KR)

(73) Assignee: **SAMSUNG ELECTRONICS CO.,
LTD.**, Suwon-si (KR)

( * ) Notice: Subject to any disclaimer, the term of this
patent is extended or adjusted under 35
U.S.C. 154(b) by 169 days.

(21) Appl. No.: 18/757,567

(22) Filed: Jun. 28, 2024

(65) Prior Publication Data

US 2025/0123573 A1 Apr. 17, 2025

(30) Foreign Application Priority Data

Oct. 13, 2023 (KR) ........................ 10-2023-0136658

(51) Int. Cl.
*G03F 7/00* (2006.01)
*B65G 21/22* (2006.01)
(52) U.S. Cl.
CPC ......... *G03F 7/70758* (2013.01); *B65G 21/22*
(2013.01); *G03F 7/70033* (2013.01); *G03F
7/70716* (2013.01); *G03F 7/70808* (2013.01)
(58) Field of Classification Search
CPC ........ B65G 41/02; B65G 39/20; B65G 21/22;
H02G 11/00; B65H 75/34; F16L 3/01;
G03F 7/70716; G03F 7/70808; G03F
7/70825; G03F 7/70975; G03F 7/70758
See application file for complete search history.

(56) References Cited

U.S. PATENT DOCUMENTS

| | | | |
|---|---|---|---|
| 11,150,564 B1 | 10/2021 | Chen et al. | |
| 11,520,243 B2 | 12/2022 | Wang et al. | |
| 2022/0066331 A1* | 3/2022 | Wang | G03F 7/70716 |
| 2023/0020727 A1* | 1/2023 | Dürager | G01N 29/043 |

FOREIGN PATENT DOCUMENTS

| | | | |
|---|---|---|---|
| JP | S55136602 A | 10/1980 | |
| JP | 2002-154429 A | 5/2002 | |
| JP | 2004-196434 A | 7/2004 | |
| WO | WO-2019158227 A1 * | 8/2019 | B65G 54/02 |

OTHER PUBLICATIONS

Machine translation of WO-2019158227-A1 (Year: 2019).*

* cited by examiner

*Primary Examiner* — Steven H Whitesell
(74) *Attorney, Agent, or Firm* — Muir Patent Law, PLLC

(57) ABSTRACT

A lithography apparatus comprises a wafer stage, a cable
configured to be bent as the wafer stage moves, a first
support configured to prevent the cable from sagging, and to
support the cable to maintain a bent state of the cable when
the cable moves, a first rail installed on a first side of the
cable, and including curved track extending in a direction
from a lower portion of the cable toward an upper portion of
the cable, wherein the first rail includes a concave first
surface, a second rail installed on a second side of the cable
opposite the first side of the cable, and including curved
track extending in the direction from the lower portion of the
cable toward the upper portion of the cable, wherein the
second rail includes a concave second surface.

20 Claims, 14 Drawing Sheets

1000(230)

144A-1

144A-2

ML2

121A

LITHOGRAPHY APPARATUS

CROSS-REFERENCE TO RELATED APPLICATION

This application claims priority to Korean Patent Application No. 10-2023-0136658 filed on Oct. 13, 2023 in the Korean Intellectual Property Office, and all the benefits accruing therefrom under 35 U.S.C. 119, the contents of which in its entirety are herein incorporated by reference.

BACKGROUND

Technical Field

The present disclosure relates to a lithography apparatus, specifically a photolithography apparatus, and more specifically, to a photolithography apparatus using extreme ultraviolet (EUV).

Description of Related Art

EUV lithography provides finer pattern resolution than conventional optical lithography (UV lithography) and thus is currently considered a candidate for next-generation lithography. Increasing the resolution using the EUV lithography stems from a fact that the conventional optical lithography is performed using a wavelength in a range of 150 to 250 nm, whereas the EUV lithography is performed using a wavelength in a range of 11 to 15 nm. In general, the shorter the wavelength of the light used for pattern imaging in lithography is, the finer the resolution obtained is.

An EUV lithography apparatus needs to move a mask and a wafer, such as a semiconductor wafer, to form a pattern. The mask or the wafer moves on a stage. Particles may be produced due to collision or abrasion between units connected to each other during an operation of the stage. These particles contaminate the wafer and cause decrease in yield.

Therefore, a lithography apparatus that reduces the production of the particles during the operation of the stage is desirable.

SUMMARY

Embodiments of the present invention provide a lithography apparatus in which particle production is reduced, and a product yield is increased.

The benefits of the present invention are not limited to the above-mentioned examples. Other advantages according to the present invention that are not mentioned may be understood based on following descriptions, and may be more clearly understood based on embodiments according to the present disclosure. Further, it will be easily understood that the purposes and advantages according to the present disclosure may be realized using means shown in the claims or combinations thereof.

According to an aspect of the present disclosure, there is provided a lithography apparatus comprising a wafer stage, a cable connected to the wafer stage, a first support supporting the cable, a first rail installed on a first side of the cable, and including a curved track extending in a direction from a lower portion of the cable toward an upper portion of the cable, wherein the first rail includes a concave first surface, a second rail installed on a second side of the cable opposite the first side of cable, and including curved track extending in the direction from the lower portion of the cable toward the upper portion of the cable, wherein the second rail includes a concave second surface, a first wheel configured to roll along the first surface of the first rail, wherein the first wheel includes a first N pole area and a first S pole area, wherein a surface of the first wheel facing the first surface of the first rail has a curvature, a second wheel configured to roll along the second surface of the second rail, wherein the second wheel includes a second N pole area and a second S pole area, wherein a surface of the second wheel facing the second surface of the second rail has a curvature, a first sliding member, wherein the first wheel is mounted on the first sliding member, and is connected to the first support through a first bracket on a side surface of the first sliding member, and a second sliding member, wherein the second wheel is mounted on the second sliding member and is connected to the first support through a second bracket on a side surface of the second sliding member, wherein the first surface of the first rail includes a first magnetic area, a second magnetic area spaced apart from the first magnetic area, and a third magnetic area between the first magnetic area and the second magnetic area, wherein the third magnetic area includes a third S pole area vertically overlapping the first N pole area of the first wheel, and a third N pole area vertically overlapping the first S pole area of the first wheel, wherein the second surface of the second rail includes a fourth magnetic area, a fifth magnetic area spaced apart from the fourth magnetic area, and a sixth magnetic area between the fourth magnetic area and the fifth magnetic area, wherein the sixth magnetic area includes a fourth S pole area vertically overlapping the second N pole area of the second wheel, and a fourth N pole area vertically overlapping the second S pole area of the second wheel.

According to an aspect of the present disclosure, there is provided a lithography apparatus comprising a wafer stage, a cable configured to move while maintaining a bent state thereof as the wafer stage moves, a first support coupled to the cable and configured to support the cable by moving on the cable as the cable moves, a first rail disposed on a first side of the cable and including a first track curved along a direction in which the cable is bent, a second rail disposed on a second side of the cable opposite the first side of the cable and including a second track curved along a direction in which the cable is bent, wherein the first and second rails are arranged parallel to each other, a first sliding member configured to move along a first surface of the first rail, wherein the first sliding member includes a first body, and a first wheel and a second wheel respectively disposed at both opposing ends of the first body, a second sliding member configured to move along a second surface of the second rail, wherein the second sliding member includes a second body, and a third wheel and a fourth wheel respectively disposed at both opposing ends of the second body, a first bracket mounted on a side surface of the first body and connects the first sliding member and the first support to each other, and a second bracket mounted on a side surface of the second body and connects the second sliding member and the first support to each other, wherein the first surface longitudinally extends in a longitudinal direction of the first rail and includes a first magnetic area on a center area of the first surface, wherein the second surface longitudinally extends in a longitudinal direction of the second rail and includes a second magnetic area on a center area of the second surface, wherein each of the first surface and the second surface is concave in an inner area thereof, wherein each of the first to fourth wheels include a convex side surface, wherein the side surface of each of the first to fourth wheels includes a first area and a second area arranged side by side and extending along a circumference of each of the first to fourth wheels, wherein the first area and the second area have different magnetic polarities.

According to an aspect of the present disclosure, there is provided a lithography apparatus comprising a wafer stage, a first cable connected to the wafer stage and configured to be bent as the wafer stage moves in a first direction, a second cable disposed under the first cable and configured to bent as the wafer stage moves in a second direction intersecting the first direction, a first support supporting the second cable and configured to prevent the second cable from sagging, a first rail disposed on a first side of the second cable and including a first track curved along a direction in which the second cable is bent, wherein the first rail includes a concave first surface, a second rail disposed on a second side of the second cable opposite the first side of the second cable and including a second track curved along a direction in which the second cable is bent, wherein the first and second rails are arranged in parallel with each other, wherein the second rail includes a concave second surface, a first sliding member configured to move along the first surface of the first rail, wherein the first sliding member includes a first body, and a first wheel and a second wheel respectively disposed at both opposing ends of the first body, wherein each of the first wheel and the second wheel includes a convex surface facing the first surface of the first rail, wherein the first sliding member further includes a first bracket connecting the first body and the first support to each other, and a second sliding member configured to move along the second surface of the second rail, wherein the second sliding member includes a second body, and a third wheel and a fourth wheel respectively disposed at both opposing ends of the second body, wherein each of the third wheel and the fourth wheel includes a convex surface facing the second surface of the second rail, wherein the second sliding member further includes a second bracket connecting the second body and the first support to each other, wherein the first surface includes a first N pole area and a first S pole area longitudinally extending in a longitudinal direction of the first rail, and arranged side by side in a center area of the first surface, wherein the second surface includes a second N pole area and a second S pole area longitudinally extending in a longitudinal direction of the second rail, and arranged side by side in a center area of the second surface, wherein each of the first to fourth wheels includes a first area and a second area extending along a circumference thereof and arranged side by side, wherein the first area and the second area have different magnetic polarities, wherein when each of the first and second wheels rolls along the first surface of the first rail, the first area of each of the first and second wheels contacts the first S pole area, and the second area of each of the first and second wheels contacts the first N pole area, wherein when each of the third and fourth wheels rolls along the second surface of the second rail, the first area of each of the third and fourth wheels contacts the second S pole area, and the second area of each of the third and fourth wheels contacts the second N pole area, wherein the first area has N-pole magnetism, and the second area has S-pole magnetism.

It should be noted that the effects of the present disclosure are not limited to those described above, and other effects of the present disclosure will be apparent from the following description.

BRIEF DESCRIPTION OF DRAWINGS

The above and other aspects and features of the present disclosure will become more apparent by describing in detail illustrative embodiments thereof with reference to the attached drawings, in which.

DETAILED DESCRIPTION

Figure 1:
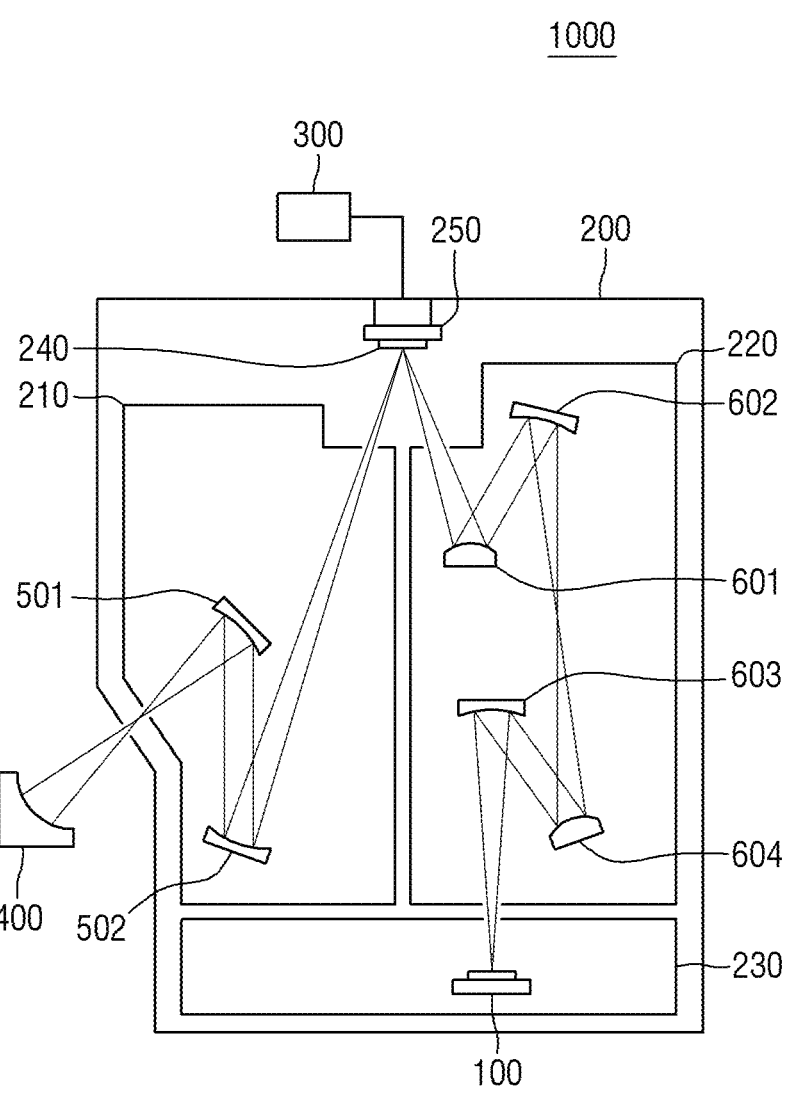
FIG. 1 is an illustrative diagram schematically showing a lithography apparatus according to some embodiments.

For simplicity and clarity of illustration, elements in the drawings are not necessarily drawn to scale. The same reference numbers in different drawings represent the same or similar elements, and as such perform similar functionality. Further, descriptions and details of well-known steps and elements are omitted for simplicity of the description. Furthermore, in the following detailed description of the present disclosure, numerous specific details are set forth in order to provide a thorough understanding of the present disclosure. However, it will be understood that the present disclosure may be practiced without these specific details. In other instances, well-known methods, procedures, components, and circuits have not been described in detail so as not to unnecessarily obscure aspects of the present disclosure. Examples of various embodiments are illustrated and described further below. It will be understood that the description herein is not intended to limit the claims to the specific embodiments described. On the contrary, it is intended to cover alternatives, modifications, and equivalents as may be included in the spirit and scope of the present disclosure as defined by the appended claims.

A shape, a size, a ratio, an angle, a number, etc. disclosed in the drawings for illustrating embodiments of the present disclosure are illustrative, and the present disclosure is not limited thereto.

The terminology used herein is for the purpose of describing particular embodiments only and is not intended to limit the present disclosure. As used herein, the singular forms "a" and "an" are intended to include the plural forms as well, unless the context clearly indicates otherwise. It will be further understood that the terms "comprise", "comprising", "include", and "including" when used in this specification, specify the presence of the stated features, integers, operations, elements, and/or components, but do not preclude the presence or addition of one or more other features, integers, operations, elements, components, and/or portions thereof. As used herein, the term "and/or" includes any and all combinations of one or more of the associated listed items. Expression such as "at least one of" when preceding a list of elements may modify an entirety of list of elements and may not modify the individual elements of the list. When referring to "C to D", this means C inclusive to D inclusive unless otherwise specified.

It will be understood that, although the terms "first", "second", "third", and so on may be used herein to illustrate various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described under could be termed a second element, component, region, layer or section, without departing from the spirit and scope of the present disclosure.

In addition, it will also be understood that when a first element or layer is referred to as being present "on" or "beneath" a second element or layer, the first element may be disposed directly on or beneath the second element or may be disposed indirectly on or beneath the second element with a third element or layer being disposed between the first and second elements or layers. It will be understood that when an element or layer is referred to as being "connected to", or "coupled to" another element or layer, it may be directly on, connected to, or coupled to the other element or layer, or one or more intervening elements or layers may be present. In addition, it will also be understood that when an element or layer is referred to as being "between" two elements or layers, it may be the only element or layer between the two elements or layers, or one or more intervening elements or layers may also be present.

Further, as used herein, when a layer, film, region, plate, or the like is disposed "on" or "on a top" of another layer, film, region, plate, or the like, the former may contact the latter or still another layer, film, region, plate, or the like may be disposed between the former and the latter. As used herein, when a layer, film, region, plate, or the like is directly disposed "on" or "on a top" of another layer, film, region, plate, or the like, the former contacts the latter and another layer, film, region, plate, or the like is not disposed between the former and the latter. Further, as used herein, when a layer, film, region, plate, or the like is disposed "below" or "under" another layer, film, region, plate, or the like, the former may contact the latter or still another layer, film, region, plate, or the like may be disposed between the former and the latter. As used herein, when a layer, film, region, plate, or the like is directly disposed "below" or "under" another layer, film, region, plate, or the like, the former contacts the latter and another layer, film, region, plate, or the like is not disposed between the former and the latter. For example, when one element "contacts" or is "in contact with" another element, there are no intervening elements present at the point of contact between the two elements.

Unless otherwise defined, all terms including technical and scientific terms used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Certain embodiments may be implemented differently from embodiments disclosed in the drawings, and a function or operation specified in a specific block may occur in a sequence different from that specified in a flowchart. For example, two consecutive blocks may be actually executed at the same time. Depending on a related function or operation, the blocks may be executed in a reverse sequence in certain embodiments.

In descriptions of temporal relationships, for example, temporal precedent/sequential relationships between two events such as "after", "subsequent to", "before", etc., another event may occur therebetween unless "directly after", "directly subsequent" or "directly before" is not indicated. The features of the various embodiments of the present disclosure may be partially or entirely combined with each other, and may be technically associated with each other or operate with each other. The embodiments may be implemented independently of each other and may be implemented together in an association relationship. Spatially relative terms, such as "beneath," "below," "lower," "under," "above," "upper," and the like, may be used herein for ease of illustration to illustrate one element or feature's relationship to another element or feature as illustrated in the figures. It will be understood that the spatially relative terms are intended to encompass different orientations of the device in use or in operation, in addition to the orientation depicted in the figures. For example, when the device in the drawings is turned over, elements described as "below" or "beneath" or "under" other elements or features would then be oriented "above" the other elements or features. Thus, the example terms "below" and "under" may encompass both an orientation of above and below. The device may be otherwise oriented, for example, rotated 90 degrees or at other orientations, and the spatially relative descriptors used herein should be interpreted accordingly.

Hereinafter, a lithography apparatus according to some embodiments will be described with reference to the attached drawings.

FIG. 1 is an illustrative diagram schematically showing a lithography apparatus according to some embodiments.

Referring to FIG. 1, the lithography apparatus 1000 according to some embodiments may include a main chamber 200, a first sub-chamber 210, a second sub-chamber 220, a third sub-chamber 230, a reticle stage 250, a reticle stage power supply 300, a light source 400, illumination system mirrors 501 and 502, projection optical-system mirrors 601, 602, 603, and 604, and a wafer stage 100.

An inner space of the main chamber 200 may be maintained in a vacuum state. For example, an inner space of each of the first sub-chamber 210, the second sub-chamber 220, and the third sub-chamber 230 may be maintained in a vacuum state.

The first sub-chamber 210 may be positioned in the main chamber 200. At least one illumination system mirror 501 and/or 502 may be disposed in the first sub-chamber 210.

Exposure light reflected from the illumination system mirrors 501 and 502 and then passing through the first sub-chamber 210 may reach a reticle 240 fixed to the reticle stage 250. In order to increase efficiency in reflection of the exposure light, the inner space of the first sub-chamber 210 may be maintained in a vacuum state.

The second sub-chamber 220 may be positioned in the main chamber 200. At least one projection optical-system mirror 601, 602, 603, and/or 604 may be disposed in the second sub-chamber 220.

The reticle stage 250 may be positioned on top of the main chamber 200. The reticle 240 may be fixed onto the reticle stage 250. The reticle stage 250 may perform a scanning operation. The reticle stage 250 may perform a stepping operation.

The reticle 240 may reflect the exposure light which has passed through the first sub-chamber 210 toward the second sub-chamber 220. The exposure light which has passed through the first sub-chamber 210 may be incident on a first surface of the reticle 240 where a pattern area is formed.

A remaining portion of the exposure light not absorbed by the pattern area of the exposure light incident on the first surface of the reticle 240 may be incident to a first projection optical-system mirror 601 disposed in the second sub-chamber 220.

The exposure light incident into the second sub-chamber 220 may be sequentially reflected from the first to fourth projection optical-system mirrors 601, 602, 603, and 604 and then may be incident onto the third sub-chamber 230. For example, the exposure light reflected from the surface of the reticle 240 may be reflected from the projection optical-system mirrors 601, 602, 603, and 604 and then may be radiated onto the wafer on the wafer stage 100. In order to increase efficiency in the reflection of the exposure light, the inner space of the second sub-chamber 220 may be maintained in a vacuum state.

The reticle stage power supply 300 is electrically connected to the reticle 240 and the reticle stage 250. Since the reticle stage power supply 300 is electrically connected to the reticle stage 250 and the reticle 240, an electrostatic force is generated between the reticle stage 250 and the reticle 240. For example, the reticle 240 may be fixed to the reticle stage 250 under/by the electrostatic force. As used herein, components described as being "electrically connected" are configured such that an electrical signal can be transferred from one component to the other (although such electrical signal may be attenuated in strength as it transferred and may be selectively transferred).

The light source 400 may be positioned outside the main chamber 200. The light source 400 may provide the exposure light used for lithography. The light source 400 may radiate/emit the exposure light to the illumination system mirrors 501 and 502 disposed in the first sub-chamber 210.

The light source 400 may be, for example, a discharge produced plasma (DPP) EUV light source, a laser produced plasma (LPP) EUV light source, a hybrid EUV light source, a synchrotron EUV light source, etc. However, the present disclosure is not limited thereto. The mirrors 501, 502, 601, 602, 603, and 604 may be positioned in the first sub-chamber 210 and the second sub-chamber 220. Each of the mirrors 501, 502, 601, 602, 603, and 604 may be an oblique incidence mirror in which the exposure light radiated/emitted from the light source 400 is incident on a reflective surface of the mirror at an oblique incident angle, or a multi-layer mirror in which a reflective surface of the mirror is multi-layered.

In order to transfer a fine pattern on the wafer, each of the projection optical-system mirrors 601, 602, 603, and 604 may have high resolution. The number of mirrors 501, 502, 601, 602, 603, and 604 may be, for example, 6. However, the present disclosure is not limited thereto.

The third sub-chamber 230 may be positioned in the main chamber 200. The wafer stage 100 may be disposed in the third sub-chamber 230. Although one wafer stage 100 is shown in the third sub-chamber 230, the present disclosure is not limited thereto. For example, there may be two or more wafer stages 100 in the third sub-chamber 230. The inner space of the third sub-chamber 230 may be maintained in a vacuum state.

The wafer stage 100 may be disposed in the third sub-chamber 230. The wafer stage 100 may load the wafer thereon. The wafer may be fixed onto the wafer stage 100. The wafer stage 100 may be movable for fine alignment. The wafer stage 100 may perform the scanning operation. The wafer stage 100 may perform the stepping operation.

Hereinafter, the wafer stage 100 and components around the wafer stage 100 will be described in detail.

Figure 2:
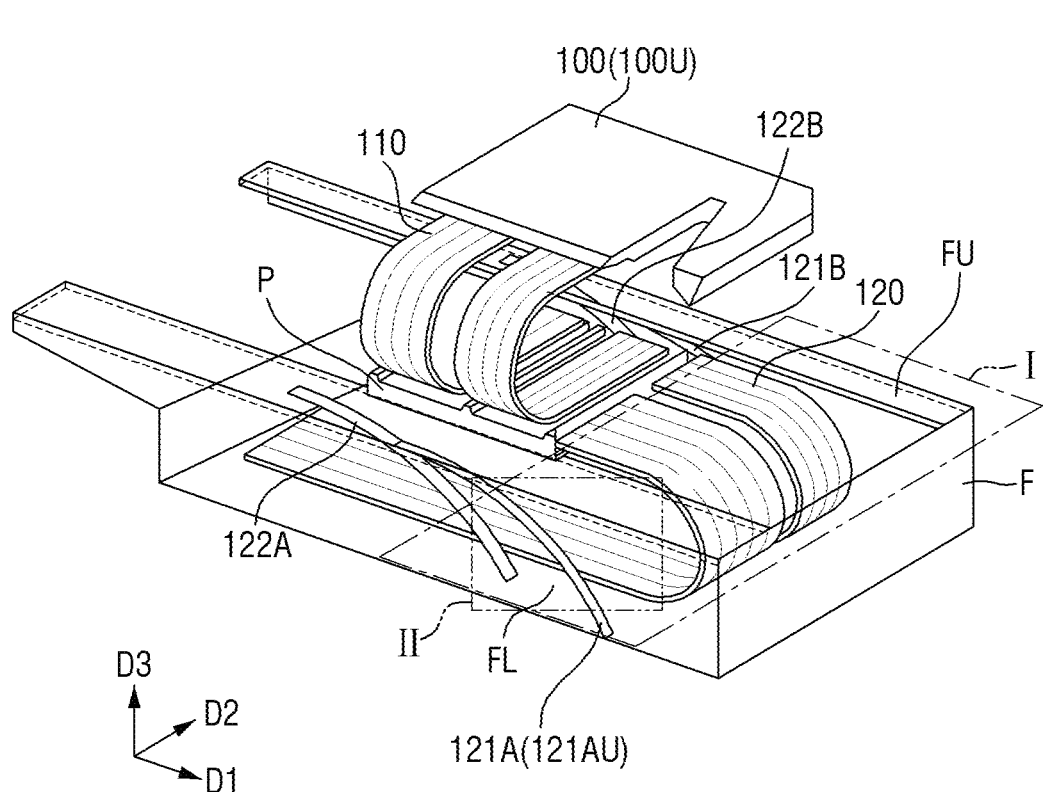
FIG. 2 is an illustrative diagram for illustrating components in the third sub-chamber of FIG. 1.
Figure 3:
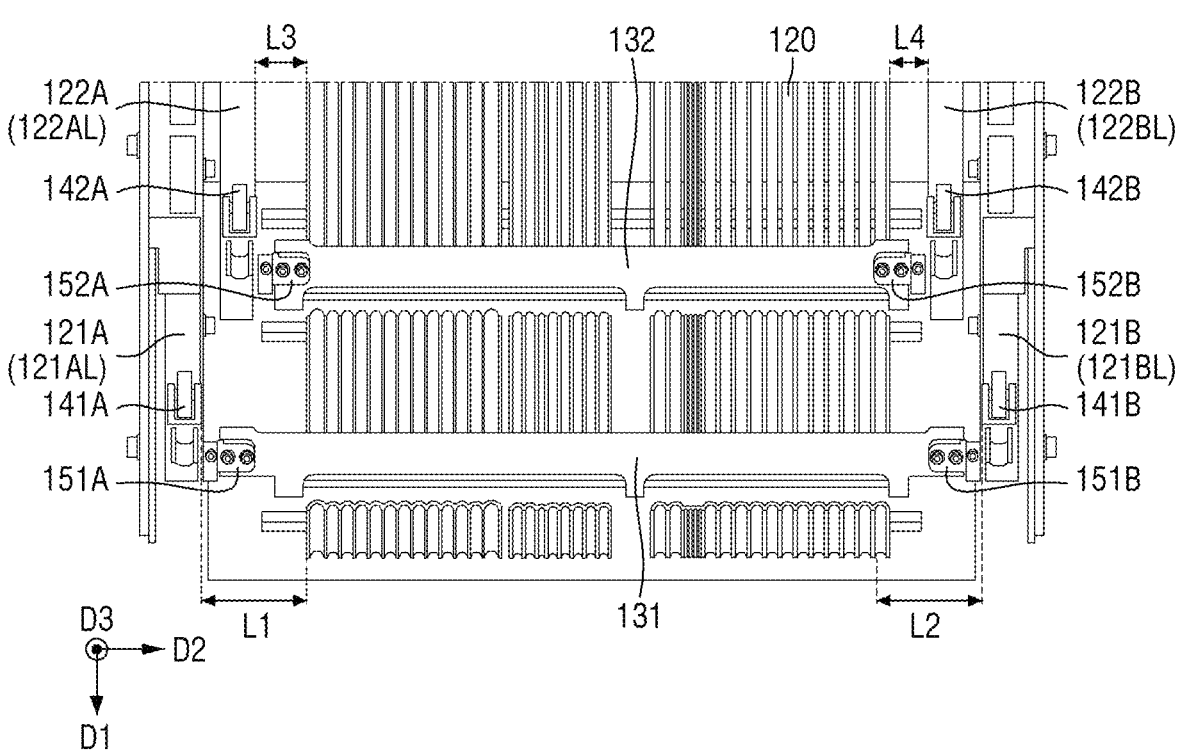
FIG. 3 is an illustrative enlarged view showing an area I of FIG. 2.
Figure 4:
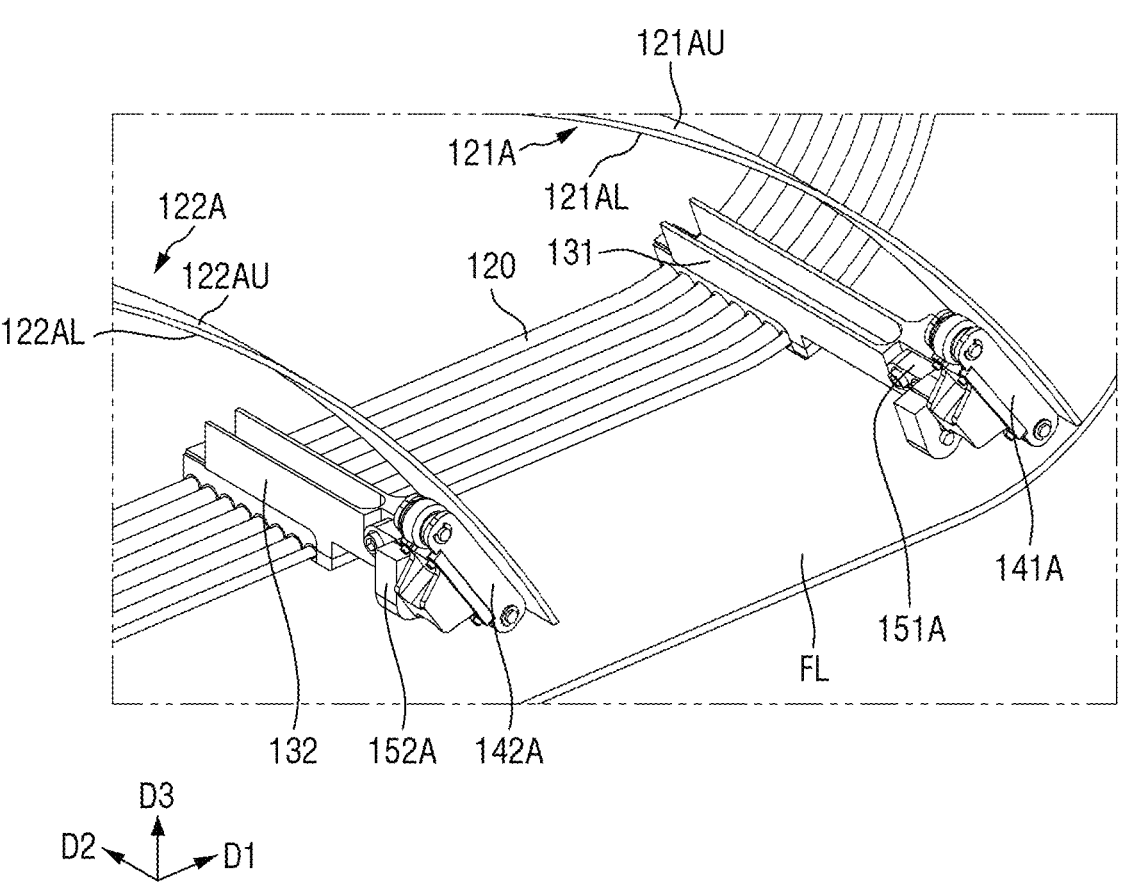
FIG. 4 is an illustrative enlarged view showing an area II of FIG. 2.

FIG. 2 is an illustrative diagram for illustrating components in the third sub-chamber of FIG. 1. FIG. 3 is an illustrative enlarged view showing an area I of FIG. 2. FIG. 4 is an illustrative enlarged view showing an area II of FIG. 2. Hereinafter, with reference to FIGS. 2 to 4, the wafer stage 100 in the third sub-chamber 230 of FIG. 1 and surrounding components around the wafer stage 100 will be described.

The third sub-chamber 230 may include the wafer stage 100, a first cable 110, a second cable 120, a plate P, a frame F, a first support unit 131, a second support unit 132, a first rail 121A, a second rail 121B, a third rail 122A, a fourth rail 122B, a first sliding member 141A, a second sliding member 141B, a third sliding member 142A and a fourth sliding member 142B.

FIG. 2 shows the components of the third sub-chamber 230 except for the first support unit 131, the second support unit 132, the first sliding member 141A, the second sliding member 141B, the third sliding member 142A, and the fourth sliding member 142B. Each of support units disclosed in the present disclosure may also be referred to as a support. Each of sliding members disclosed in the present disclosure may be a sliding frame.

The wafer stage 100 may include a first surface 100U and a second surface opposite each other in a third direction D3. The first surface 100U may be an upper surface of the wafer stage 100, and the second surface may be a lower surface of the wafer stage 100. In a state where the wafer is loaded on the first surface 100U of the wafer stage 100, the wafer stage 100 may move in a first direction D1, an opposite direction to the first direction D1, a second direction D2, or a direction opposite to the second direction D2 for measurement and exposure.

One end of the first cable 110 may be connected to the wafer stage 100. The other end of the first cable 110 may be connected to the plate P. The first cable 110 may extend in its longitudinal direction. The first cable 110 may be connected to the wafer stage 100, and may be maintained in a U-shaped bent state as the wafer stage 100 moves in the second direction D2 or in the direction opposite to the second direction D2. For example, one of the opposite ends of the first cable 110 in a longitudinal direction may vertically overlap the first cable 110 while the wafer stage 100 moves, e.g., in the second direction D2, and/or when the wafer stage 100 is in a rest position. As the first cable 110 maintains the bent state thereof, one end and the other end of the first cable 110 may be spaced apart from each other in the third direction D3 and/or face each other.

The first cable 110 may include a plurality of sub-cables. Each of the plurality of sub-cables may extend in its longitudinal direction and may be maintained in a U-shaped bent state as the wafer stage 100 moves in the second direction D2 or in a direction opposite to the second direction D2. For example, one of the opposite ends of each of the sub-cables of the first cable 110 in a longitudinal direction may vertically overlap the corresponding sub-cable while the wafer stage 100 moves, e.g., in the second direction D2, and/or while the wafer stage 100 is in a rest position.

The first cable 110 may be used as a path to transmit data. For example, the first cable 110 may transmit a value sensed by a sensor provided on the wafer stage 100 to an optical system within the lithography apparatus 1000. Furthermore, conversely, the first cable 110 may transmit a signal generated by the optical system within the lithography apparatus 1000 to the wafer stage 100.

The first cable 110 may be connected to the wafer stage 100 and may be used as a path along which air and/or water flows to the wafer stage 100. The first cable 110 may include a flexible material. For example, the outer shell of the first cable 110 may include a fluorine F-based material.

The second cable 120 may be disposed under the first cable 110. The plate P may be disposed between the first cable 110 and the second cable 120. The second cable 120 may be disposed inside the frame F including a first surface FU and a second surface FL facing each other in the third direction D3. In this regard, the first surface FU may be an upper surface of the frame F, and the second surface FL may be a lower surface of the frame F. For example, the first surface FU of the frame F may face downwards from an upper portion of the frame F, and the second surface FL of the frame F may face upwards from a lower portion of the frame F. One end of the second cable 120 may be connected to the plate P. The other end of the second cable 120 may be disposed on the second surface FL of the frame F. In this regard, one end of the second cable 120 connected to the plate P may be an upper portion of the second cable 120, and the other end of the second cable 120 disposed on the second surface FL of the frame F may be a lower portion of the second cable 120.

The second cable 120 may extend in its longitudinal direction. The second cable 120 may be connected to the plate P and may be maintained in a U-shaped bent state as the wafer stage 100 moves in the first direction D1 or in the direction opposite to the first direction D1. As the second cable 120 maintains the bent state thereof, one end and the other end of the second cable 120 may be spaced apart from each other in the third direction D3 and/or face each other. For example, one of the opposite ends of the second cable 120 in a longitudinal direction may vertically overlap the second cable 120 while the wafer stage 100 moves, e.g., in the first direction D1, and/or when the wafer stage 100 is in a rest position.

The second cable 120 may include a plurality of sub-cables. Each of the plurality of sub-cables may extend in its longitudinal direction and may be maintained in the U-shaped bent state as the wafer stage 100 moves in the first direction D1 or in a direction opposite to the first direction D1. For example, one of the opposite ends of each of the sub-cables of the second cable 120 in a longitudinal direction may vertically overlap the corresponding sub-cable while the wafer stage 100 moves, e.g., in the first direction D1, and/or while the wafer stage 100 is in the rest position. As will be described later, the plurality of sub-cables of the second cable 120 may be bound to each other using the first support unit 131 and the second support unit 132.

Like the first cable 110, the second cable 120 may be used as a path to transmit data. For example, the second cable 120 may transmit the value sensed by the sensor provided in the wafer stage 100 to the optical system in the lithography apparatus 1000 or may transmit the signal generated by the optical system in the lithography apparatus 1000 to the wafer stage 100. Furthermore, like the first cable 110, the second cable 120 may be used as a path through which air and/or water flows to the wafer stage 100. The description of the material included in the second cable 120 is the same as the description of the material included in the first cable 110. Thus, descriptions duplicate with the description of the first cable 110 are omitted below.

In this way, in order that the first cable 110 and the second cable 120 provide the data, the air, and/or the water to the wafer stage 100, the first cable 110 and the second cable 120 may move together with the wafer stage 100 as the wafer stage 100 moves in the first direction D1 or the second direction D2. In this regard, the first direction D1 may be a longitudinal direction of the second cable 120, and the second direction D2 may be a longitudinal direction of the first cable 110, e.g., in a plan view. The first direction D1 and the second direction D2 may intersect (e.g., be perpendicular to) each other and/or may be parallel to the first surface 100U of the wafer stage 100.

As the wafer stage 100 moves in the second direction D2, the first cable 110 (e.g., at least a portion of the first cable 110) connected to the wafer stage 100 may also move in the second direction D2. Furthermore, as the wafer stage 100 moves in the first direction D1, the second cable 120 (e.g., at least a portion of the second cable 120) may also move in the first direction D1.

As the wafer stage 100 moves in the first direction D1, a bent position/amount of the second cable 120 may change. For example, a bent amount of the second cable when the second cable 120 moves in the first direction D1 may be larger than a bent amount of the second cable when the second cable 120 moves in the opposite direction to the first direction D1. For example, the U-shaped bent second cable 120 may have an upper portion and a lower portion with the bent portion as a boundary between the upper portion and the lower portion of the second cable 120, and the lower portion of the second cable 120 may get longer when the wafer stage 100 moves in the first direction D1. Accordingly, sagging may occur at the lower portion of the second cable 120, e.g., when the lower portion of the second cable 120 gets longer. When the second cable 120 sags excessively, loss of the data transmitted via the second cable 120 may occur, or a transmission rate of the data transmitted via the second cable 120 may be lowered. In one example, when a moving speed of the wafer stage 100 is lowered to compensate for the above data loss or the lowered data transmission rate, a production capacity of the lithography apparatus 1000 using EUV may be reduced. For example, the second cable 120 may be damaged when the second cable 120 sags excessively and/or over time.

As the wafer stage 100 moves in the first direction D1, the second cable 120 (e.g., an upper portion of the second cable 120) also moves in the first direction D1. When the wafer stage 100 moves in the first direction D1, twist of the second cable 120 may occur. When the twist of the second cable 120 occurs, loss of data transmitted via the second cable 120 may occur. Furthermore, the transmission rate of the data transmitted via the second cable 120 may be lowered.

The first support unit 131 may be coupled to the second cable 120. For example, as shown in FIG. 3, the first support unit 131 may bind the second cable 120 or the plurality of sub-cables of the second cable 120 to each other in a bundle. When the second cable 120 moves in the first direction D1 as the wafer stage 100 moves in the first direction D1, the first support unit 131 may support the second cable 120 to maintain the bent state of the second cable 120 and to prevent the second cable 120 from sagging. Furthermore, the first support unit 131 may limit the twisting of the second cable 120 by binding the sub-cables of the second cable 120 to each other in a bundle.

The second support unit 132 may be coupled to the second cable 120 while maintaining a constant spacing from the first support unit 131. The first support unit 131 and the second support unit 132 may be spaced apart from each other in the longitudinal direction of the second cable 120. For example, like the first support unit 131, the second support unit 132 may bind the second cable 120 or a plurality of sub-cables of the second cable 120 to each other in a bundle. While the second support unit 132 maintains the constant spacing from the first support unit 131, the second support unit 132 together with the first support unit 131 may support the second cable 120 to maintain the bent state of the second cable 120 and to prevent the second cable 120 from sagging when the second cable 120 moves in the first direction D1 as the wafer stage 100 moves in the first direction D1. Furthermore, the second support unit 132 may limit the twisting of the second cable 120 by binding the sub-cables of the second cable 120 to each other in a bundle. Each of the first support unit 131 and second support unit 132 may have an elongated shape having a rigid structure that includes a contact surface that engages with the second cable 120 (e.g., in one embodiment having a plurality of concave sections) and a beam portion that provides greater strength and rigidity and connects between corresponding brackets 151A and 151B or 152A and 152B. Each support unit may be described as a support beam, or simply as a support.

The first rail 121A may be installed on one side of the second cable 120, and the second rail 121B may be installed on the other side of the second cable 120. The first rail 121A and the second rail 121B may be arranged side by side (or in parallel with each other), and be spaced apart from each other in the second direction D2 while the second cable 120 is disposed therebetween. The first rail 121A may be disposed to be spaced apart from one side of the second cable 120 by a first spacing/distance L1, and the second rail 121B may be disposed to be spaced apart from the other side of the second cable 120 by a second spacing/distance L2. In this regard, one side of the second cable 120 and the other side of the second cable 120 may be opposite each other in the second direction D2. The following descriptions about the first rail 121A may be equally applied to each of the second rail 121B, the third rail 122A, and the fourth rail 122B. The description of each of the second rail 121B, the third rail 122A, and the fourth rail 122B is replaced with the description of the first rail 121A.

The first rail 121A may extend from the other end of the second cable 120 (e.g., the lower portion of the second cable 120) to the one end of the second cable 120 (e.g., the upper portion of the second cable 120). For example, the one end of the first rail 121A may contact the second surface FL of the frame F, and the other end of the first rail 121A may contact the first surface FU of the frame F. The first rail 121A may have a curved track extending from the second surface FL of the frame F to the first surface FU of the frame F. For example, as shown in FIG. 2, the direction in which the track of the first rail 121A is curved may be the same as a direction in which the second cable 120 is bent. For example, both of the second cable 130 and the first rail 121A including the track bend downwards.

The first rail 121A may include a first surface 121AL and a second surface 121AU opposite each other. The first surface 121AL of the first rail 121A may be a surface facing the second surface FL of the frame F, and the second surface 121AU of the first rail 121A may be a surface facing the first surface FU of the frame F. The first surface 121AL of the first rail 121A may be a lower surface of the first rail 121A, and the second surface 121AU of the first rail 121A may be an upper surface of the first rail 121A.

The third rail 122A may be installed on one side of the second cable 120, and the fourth rail 122B may be installed on the other side of the second cable 120. The third rail 122A and the fourth rail 122B may be arranged side by side (or in parallel with each other) and spaced apart from each other in the second direction D2 while the second cable 120 is disposed therebetween.

The third rail 122A may be disposed to be spaced apart from the first rail 121A in the first direction D1. The third rail 122A may be disposed to be spaced apart from one side of the second cable 120 by a third spacing/distance L3. In this regard, the third spacing L3 may be smaller than the first spacing L1. However, embodiments are not limited thereto. For example, a spacing between the third rail 122A and one side of the second cable 120 may be larger than a spacing between the first rail 121A and one side of the second cable 120 in certain embodiments.

The fourth rail 122B may be disposed to be spaced apart from the second rail 121B in the first direction D1. The fourth rail 122B may be disposed to be spaced apart from the other side of the second cable 120 by a fourth spacing/distance LA. In this regard, the fourth spacing LA may be smaller than the second spacing L2. However, embodiments are not limited thereto. For example, a spacing between the fourth rail 122B and the other side of the second cable 120 may be larger than a spacing between the second rail 121B and the other side of the second cable 120 in certain embodiments.

In some embodiments, a spacing/distance by which the third rail 122A and the first rail 121A are spaced apart from each other in the first direction D1 and a spacing/distance by which the fourth rail 122B and the second rail 121B are spaced apart from each other in the first direction D1 may be equal to each other. However, the embodiment is not limited thereto.

In some embodiments, the spacing between the first rail 121A and one side of the second cable 120 and the spacing between the second rail 121B and the other side of the second cable 120 may be equal to each other. The spacing between the third rail 122A and one side of the second cable 120 and the spacing between the fourth rail 122B and the other side of the second cable 120 may be equal to each other. However, embodiments are not limited thereto.

The first to fourth sliding members 141A, 141B, 142A, and 142B may move along the first to fourth rails 121A, 121B, 122A, and 122B, respectively. At this time, the first to fourth sliding members 141A, 141B, 142A, and 142B may move along the lower surfaces of the first to fourth rails 121A, 121B, 122A, and 122B, respectively. For example, as shown in FIG. 4, the first sliding member 141A may move along the first surface 121AL as the lower surface of the first rail 121A. Likewise, when the third rail 122A includes a first surface 122AL as a lower surface and a second surface 122AU as an upper surface thereof, the second sliding member 142A may move along the first surface 122AL as the lower surface of the third rail 122A. For example, the first to fourth sliding members 141A, 141B, 142A, and 142B may contact the lower surfaces of the first to fourth rails 121A, 121B, 122A, and 122B respectively while moving along the respective lower surfaces of the first to fourth rails 121A, 121B, 122A, and 122B.

The first sliding member 141A may be connected to the first support unit 131 via or through a first bracket 151A, and the second sliding member 141B may be connected to the first support unit 131 via or through a second bracket 151B. The third sliding member 142A may be connected to the second support unit 132 via or through a third bracket 152A, and the fourth sliding member 142B may be connected to the second support unit 132 via or through a fourth bracket 152B.

As the first and second sliding members 141A and 141B move along the lower surface 121AL of the first rail 121A and the lower surface 121BL of the second rail 121B, respectively, the first support unit 131 may move along the longitudinal direction of the second cable 120 while supporting the second cable 120 to prevent the second cable 120 from sagging and to prevent twisting of the second cable 120. Furthermore, as the third and fourth sliding members 142A and 142B move along the lower surface 122AL of the third rail 122A and the lower surface 122BL of the fourth rail 122B, respectively, the second support unit 132 may move along the longitudinal direction of the second cable 120 while maintaining a constant spacing from the first support unit 131 and supporting the second cable 120 to prevent the second cable 120 from sagging, and to prevent twisting of the second cable 120.

Figure 5:
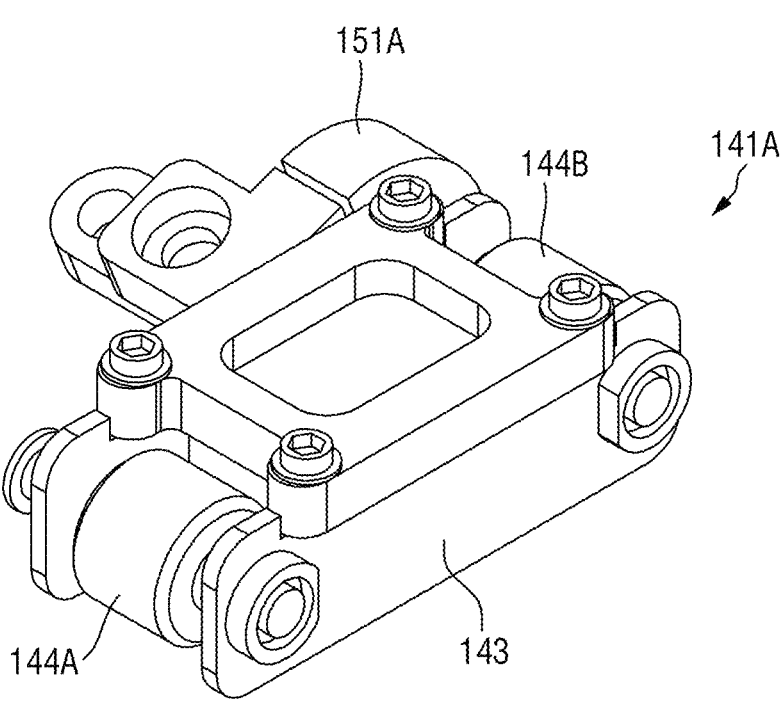
FIG. 5 is an illustrative diagram for illustrating the first sliding member in FIG. 4.

FIG. 5 is an illustrative diagram for illustrating the first sliding member in FIG. 4.

The following descriptions of the first sliding member 141A may be equally applied to each of the second to fourth sliding members 141B, 142A, and 142B. Thus, the description about each of the second to fourth sliding members 141B, 142A, and 142B is replaced with the description about the first sliding member 141A.

Referring to FIG. 5, the first sliding member 141A may include a body 143, a first wheel 144A, and a second wheel 144B. The first wheel 144A and the second wheel 144B may be respectively mounted on both opposing ends of the body 143. When the first sliding member 141A moves along the lower surface 121AL (as shown in FIG. 3) of the first rail 121A (as shown in FIG. 3), the first wheel 144A and the second wheel 144B may roll along the lower surface 121AL of the first rail 121A. The first bracket 151A may be mounted on one side of the body 143. The first sliding member 141A may be connected to the first support unit 131 (as shown in FIG. 3) via or through the first bracket 151A. Accordingly, when the second cable 120 moves in the first direction D1 as the wafer stage 100 (shown in FIG. 2) moves in the first direction D1, the first support unit 131 supporting the second cable 120 may pull the first sliding member 141A toward the first support unit 131 or in a direction where the first support unit 131 moves via or through the first bracket 151A. Accordingly, the first support unit 131 may support the second cable 120 while the second cable 120 moves smoothly in the first direction D1.

Hereinafter, the first wheel 144A and the second wheel 144B mounted on the first sliding member 141A will be described in detail.

Figure 6:
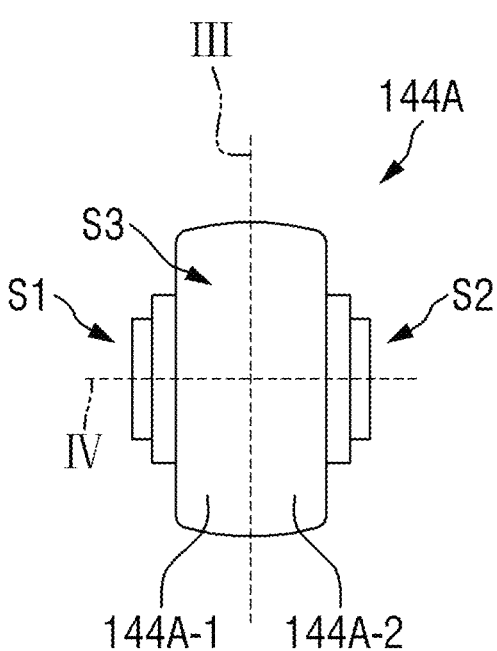
FIG. 6 is an illustrative diagram for illustrating the first wheel included in the first sliding member of FIG. 5.
Figure 7:
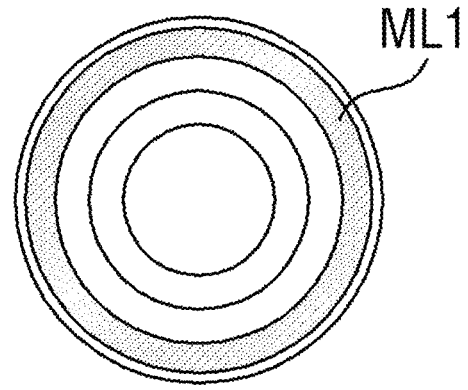
FIG. 7 and FIG. 8 are illustrative cross-sectional views cut along a line III in FIG. 6.
Figure 8:
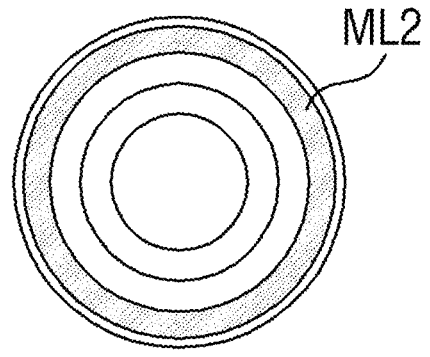
Figure 9:
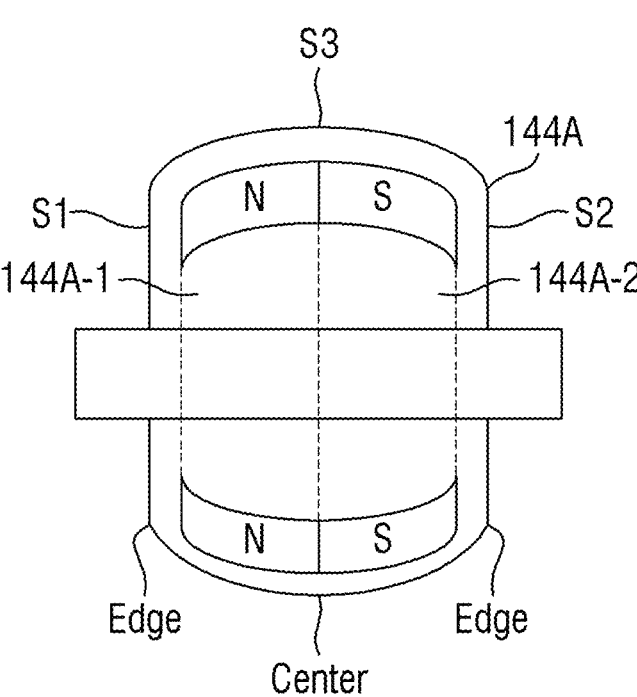
FIG. 9 is an illustrative cross-sectional view cut along a line IV in FIG. 6.

FIG. 6 is an illustrative diagram for illustrating the first wheel included in the first sliding member of FIG. 5. FIG. 7 and FIG. 8 are illustrative cross-sectional views cut along a line III in FIG. 6. FIG. 9 is an illustrative cross-sectional view cut along a line IV in FIG. 6.

The following description of the first wheel 144A mounted on the first sliding member 141A (shown in FIG. 5) may be equally applied to each of corresponding wheels respectively mounted on the second to fourth sliding members 141B, 142A, and 142B. The description of the first wheel 144A replaces the description of each of the corresponding wheels respectively mounted on the second to fourth sliding members 141B, 142A, and 142B.

Referring to FIG. 6 to FIG. 8 together, the first wheel 144A may have a cylindrical shape including a first surface S1, a second surface S2, and a third surface S3. The first surface S1 and the second surface S2 of the first wheel 144A may be opposite to each other, and may be an upper surface and a lower surface (or the lower surface and the upper surface) of the first wheel 144A, respectively. The third surface S3 of the first wheel 144A may be disposed between the first surface S1 and the second surface S2 and may be a side surface of the first wheel 144A. The first wheel 144A may be divided into a first area 144A-1 and a second area 144A-2. The first wheel 144A may be divided into the first area 144A-1 and the second area 144A-2 disposed on both sides of the line III. In this regard, dividing/cutting the first wheel 144A along the line III may be dividing/cutting, along a central line, the third surface S3 (or the first wheel 144A) in a direction parallel to the first surface S1 and the second surface S2 of the first wheel 144A.

FIG. 7 shows a cross section corresponding to the first area 144A-1 when the first wheel 144A in FIG. 6 is cut along the line III, and FIG. 8 shows a cross section corresponding to the second area 144A-2 when the first wheel 144A in FIG. 6 is cut along the line III. As shown in FIG. 7 and FIG. 8, the first area 144A-1 may include a first magnet layer ML1, and the second area 144A-2 may include a second magnet layer ML2. Each of the first magnet layer ML1 and the second magnet layer ML2 may be a permanent magnet layer.

The first magnet layer ML1 and the second magnet layer ML2 may have different polarities. For example, when the first magnet layer ML1 has N-pole magnetism, the second magnet layer ML2 may have S-pole magnetism. Conversely, when the first magnet layer ML1 has S-pole magnetism, the second magnet layer ML2 may have N-pole magnetism. In this way, the first area 144A-1 and the second area 144A-2 of the first wheel 144A may respectively include magnet layers with different polarities from each other. In a following description, an example in which the first area 144A-1 of the first wheel 144A has N-pole magnetism, and the second area 144A-2 of the first wheel 144A has S-pole magnetism will be described.

Each of the first magnet layer ML1 and the second magnet layer ML2 may extend in a concentric circle along a circumference of the first wheel 144A and along the third surface S3 as the side surface of the first wheel 144A. For example, an outer surface and an inner surface of each of the first magnet layer ML1 and the second magnet layer ML2 may extend in concentric circles in a cross-sectional view as shown in FIGS. 7 and 8. The first magnet layer ML1 and the second magnet layer ML2 may be arranged side by side and may extend along the circumference of the first wheel 144A and may be positioned in an outer area of the first wheel 144A.

Next, referring to FIG. 9, the third surface S3 as the side surface of the first wheel 144A may be curved. For example, the third surface S3 of the first wheel 144A has a shape in which a center of the third surface S3 protrudes from/beyond each of both opposing edges of the third surface S3 such that the third surface S3 has a curvature. As will be described later with reference to FIG. 11, the curvature of the side surface of the first wheel 144A may be the same as the curvature of the first surface 121AL of the first rail 121A.

Figure 10:
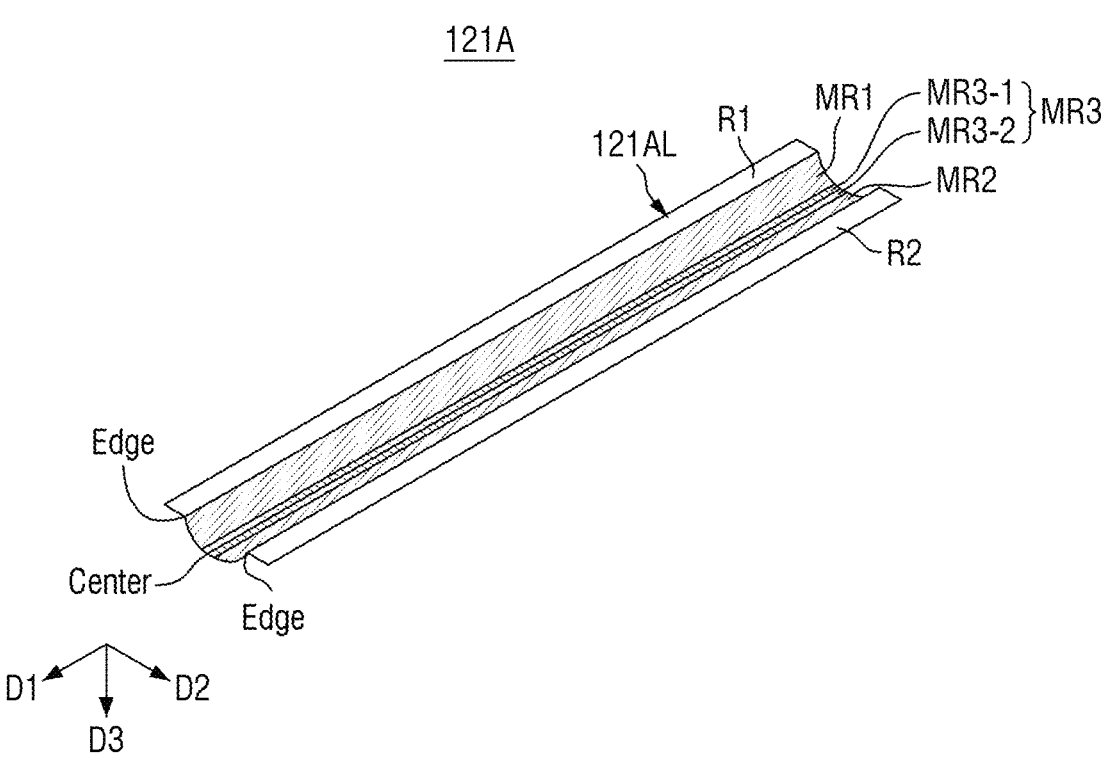
FIG. 10 is an illustrative diagram for illustrating the first rail in FIG. 2.

FIG. 10 is an illustrative diagram for illustrating the first rail in FIG. 2. For example, FIG. 10 may show a top portion of the first rail 121A longitudinally extending in the first direction D1.

The following description about the first rail 121A may be equally applied to each of the second to fourth rails 121B, 122A, and 122B. Thus, the description about each of the second to fourth rails 121B, 122A, and 122B is replaced with the following description about the first rail 121A.

Referring to FIG. 10, the first rail 121A may include the first surface 121AL and the second surface 121AU opposite each other in the third direction D3. In this regard, the first surface 121AL of the first rail 121A may be the lower surface (i.e., a bottom surface) of the first rail 121A, and may be a surface facing the second surface FL (shown in FIG. 2) as the lower surface of the frame F (shown in FIG. 2). The first surface 121AL of the first rail 121A may include a first area R1, a second area R2, a first magnetic area MR1, a second magnetic area MR2, and a third magnetic area MR3. Each of the first area R1 and the second area R2 and the first to third magnetic areas MR1, MR2, and MR3 may extend, e.g., longitudinally, in the longitudinal direction of the first rail 121A (e.g., the first direction D1).

The first area R1 and the second area R2 may be spaced apart from each other in the second direction D2. Between the first area R1 and the second area R2, the first to third magnetic areas MR1, MR2, and MR3 may be arranged. The first magnetic area MR1 may be disposed adjacent to the first area R1, and the second magnetic area MR2 may be disposed adjacent to the second area R2. For example, the first magnetic area MR1 may be disposed closer to the first area R1 than to the second area R2, and the second magnetic area MR2 may be disposed closer to the second area R2 than to the first area R1. For example, the first magnetic area MR1 and the first area R1 may share a common boundary, and the second magnetic area MR2 and the second area R2 may share a common boundary.

The first magnetic area MR1 and the second magnetic area MR2 may be disposed to be spaced apart from each other in the second direction D2. The third magnetic area MR3 may be disposed between the first magnetic area MR1 and the second magnetic area MR2.

In some embodiments, the first magnetic area MR1 and the second magnetic area MR2 may have different polarities. For example, when the first magnetic area MR1 has N-pole magnetism, the second magnetic area MR2 may have S-pole magnetism. Conversely, when the first magnetic area MR1 has S-pole magnetism, the second magnetic area MR2 may have N-pole magnetism.

The third magnetic area MR3 may be divided into a first area MR3-1 and a second area MR3-2. Each of the first area MR3-1 and the second area MR3-2 of the third magnetic area MR3 may extend, e.g., longitudinally, in the longitudinal direction (e.g., the first direction D1) of the first rail 121A, while the first area MR3-1 and the second area MR3-2 of the third magnetic area MR3 may be arranged side by side in the second direction D2. The first area MR3-1 of the third magnetic area MR3 may be disposed adjacent to the first magnetic area MR1, and the second area MR3-2 of the third magnetic area MR3 may be disposed adjacent to the second magnetic area MR2. For example, the first area MR3-1 of the third magnetic area MR3 may be disposed closer to the first magnetic area MR1 than to the second magnetic area MR2, and the second area MR3-2 of the third magnetic area MR3 may be disposed closer to the second magnetic area MR2 than to the first magnetic area MR1. For example, the first area MR3-1 of the third magnetic area MR3 and the first magnetic area MR1 may share a common boundary, and the second area MR3-2 of the third magnetic area MR3 and the second magnetic area MR2 may share a common boundary.

The first area MR3-1 and the second area MR3-2 of the third magnetic area MR3 may have different polarities. For example, when the first area MR3-1 has N-pole magnetism, the second area MR3-2 may have S-pole magnetism. Conversely, when the first area MR3-1 has S-pole magnetism, the second area MR3-2 may have N-pole magnetism.

Each of the first area MR3-1 and the second area MR3-2 of the third magnetic area MR3 may have a different polarity from an adjacent one of the first magnetic area MR1 and the second magnetic area MR2. For example, when the first magnetic area MR1 has N-pole magnetism, the first area MR3-1 of the third magnetic area MR3 may have S-pole magnetism. Furthermore, when the second magnetic area MR2 has S-pole magnetism, the second area MR3-2 of the third magnetic area MR3 may have N-pole magnetism.

As will be described later with reference to FIG. 11, the polarity of each of the first magnetic area MR1, the second magnetic area MR2, and the first area MR3-1 and the second area MR3-2 of the third magnetic area MR3 of the first surface 121AL of the first rail 121A may be determined based on the polarity of each of the first wheel 144A and the second wheel 144B rolling on the first surface 121AL of the first rail 121A.

In some embodiments, the first surface 121AL of the first rail 121A may include a concave surface/shape. For example, as shown in FIG. 10, each of the first area R1 and the second area R2 among the areas of the first surface 121AL of the first rail 121A may be flat, while a combination of the first to third magnetic areas MR1, MR2, and MR3 may be curved such that each of both opposing edges of the first rail 121A may protrude in a direction opposite to the third direction D3 with respect to the center thereof corresponding to a boundary between the first area MR3-1 and the second area MR3-2 of the third magnetic area AR3.

In some embodiments, the third magnetic area MR3 of the first rail 121A may include ferrite-based or martensite-based stainless steel (STS).

Hereinafter, the first wheel 144A and the first rail 121A are described in detail.

Figure 11:
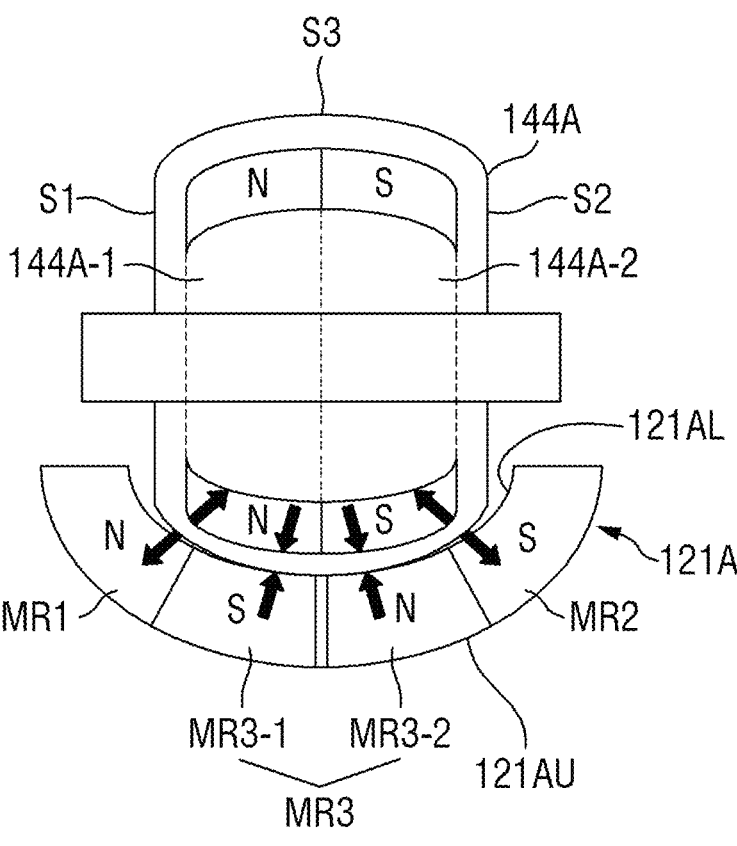
FIG. 11 is an illustrative diagram for illustrating the first rail in FIG. 2 and the first wheel in FIG. 6.

FIG. 11 is an illustrative diagram for illustrating the first rail in FIG. 2 and the first wheel in FIG. 6.

FIG. 11 is a diagram illustrating that the first wheel 144A mounted on the first sliding member 141A (shown in FIG. 5) rolls along the first surface 121AL of the first rail 121A.

Referring to FIG. 11, when the first wheel 144A rolls along the first surface 121AL of the first rail 121A, the first area 144A-1 of the first wheel 144A may face and/or vertically overlap the first area MR3-1 of the third magnetic area MR3 of the rail 121A, while the second area 144A-2 of the first wheel 144A faces and/or vertically overlaps the second area MR3-2 of the third magnetic area MR3 of the first rail 121A. For example, when the first wheel 144A rolls along the first surface 121AL of the first rail 121A, the first area 144A-1 of the first wheel 144A may contact the first area MR3-1 of the third magnetic area MR3 of the first rail 121A, and the second area 144A-2 of the first wheel 144A may contact the second area MR3-2 of the third magnetic area MR3 of the first rail 121A.

For example, when the first wheel 144A rolls along the first surface 121AL of the first rail 121A, the first area 144A-1 of the first wheel 144A may roll on the first area MR3-1 of the third magnetic area MR3 of the first rail 121A, and the second area 144A-2 of the first wheel 144A may roll on the second area MR3-2 of the third magnetic area MR3 of the first rail 121A.

In some embodiments, the polarity of each of the first magnetic area MR1, the second magnetic area MR2, and the first area MR3-1 and the second area MR3-2 of the third magnetic area MR3 of the first surface 121AL of the first rail 121A may be determined based on the polarity of each of the first area 144A-1 and the second area 144A-2 of the first wheel 144A rolling along the first surface 121AL of the first rail 121A. The polarity of the first area MR3-1 of the third magnetic area MR3 of the first rail 121A may be different from the polarity of the first area 144A-1 of the first wheel 144A. Furthermore, the polarity of the second area MR3-2 of the third magnetic area MR3 of the first rail 121A may be different from the polarity of the second area 144A-2 of the first wheel 144A. Furthermore, the polarity of the first magnetic area MR1 of the first rail 121A may be the same as the polarity of the first area 144A-1 of the first wheel 144A. The polarity of the second magnetic area MR2 of the first rail 121A may be the same as the polarity of the second area 144A-2 of the first wheel 144A.

For example, as shown in FIG. 11, when the first area 144A-1 of the first wheel 144A has N-pole magnetism, and the second area 144A-2 of the first wheel 144A has S-pole magnetism, the first area MR3-1 of the third magnetic area MR3 of the first rail 121A may have S-pole magnetism, and the second area MR3-2 may have N-pole magnetism. Furthermore, the first magnetic area MR1 of the first rail 121A may have N-pole magnetism, and the second magnetic area MR2 may have S-pole magnetism. Accordingly, when the first wheel 144A rolls along the first surface 121AL of the first rail 121A, an attractive force may act between the first wheel 144A and the third magnetic area MR3 as the center area Center of the first rail 121A, while a repulsive force may act between the first wheel 144A and the first magnetic area MR1 and between the first wheel 144A and the second magnetic area MR2.

Figure 12:
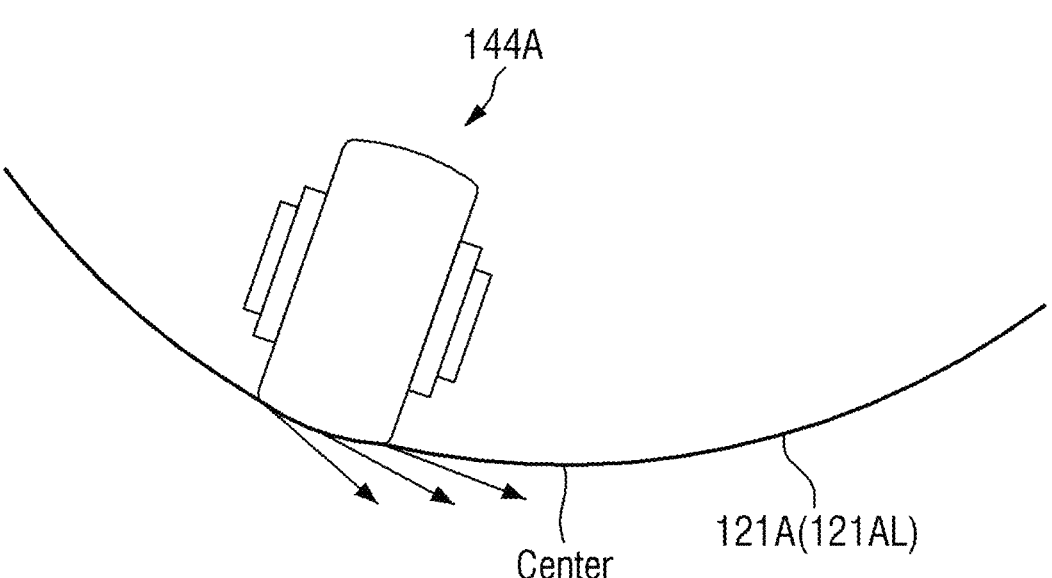
FIG. 12 to FIG. 14 are illustrative diagrams for illustrating effects of the lithography apparatus according to some embodiments.
Figure 13:
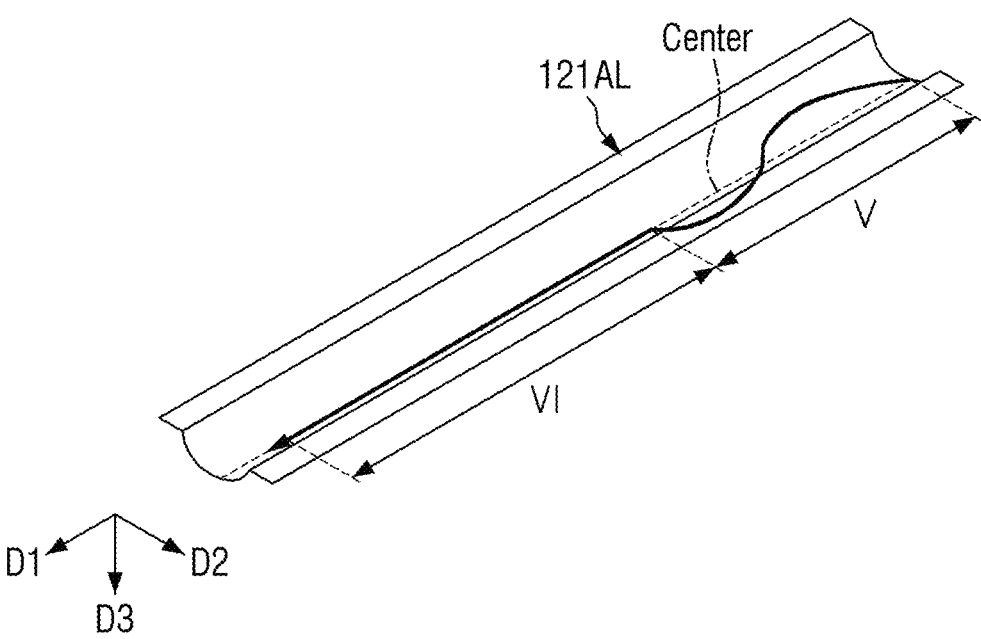
Figure 14:
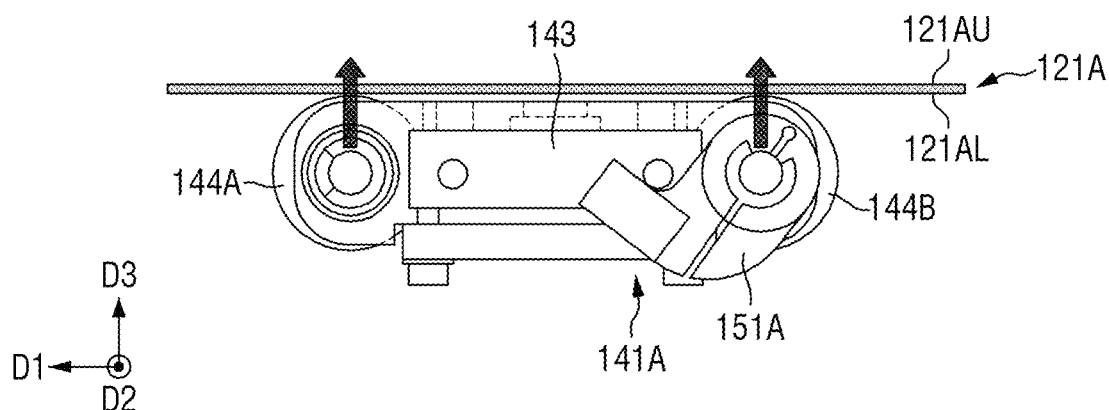

FIG. 12 to FIG. 14 are illustrative diagrams for illustrating effects of the lithography apparatus according to some embodiments.

First, referring to FIG. 12, FIG. 12 is a diagram illustrating that the first wheel 144A rolls along the first surface 121AL of the first rail 121A. As shown in FIG. 12, a phenomenon may occur in which when the first wheel 144A rolls along the first surface 121AL of the first rail 121A, the first wheel 144A is deviated from the center area Center of the first rail 121A. Thus, when the first wheel 144A is left deviated from the center area Center of the first rail 121A, a meandering movement of the first wheel 144A continues, such that wear may occur in the first wheel 144A and/or the first rail 121A at points of contact between the first wheel 144A and the first rail 121A, which may produce particles.

In this regard, as shown in FIG. 11, when the first surface 121AL of the first rail 121A has a concave shape having a curvature, and the third surface S3 as the side surface of the first wheel 144A in contact with the first surface 121AL of the first wheel 144A has a convex shape having a curvature equal to the curvature of the first surface 121AL of the first rail 121A, a restoring force toward the center of the curvature of the first surface 121AL of the first rail 121A, e.g., toward the center area Center of the first rail 121A, may act on the first wheel 144A even when the first wheel 144A is left deviated from the center area Center of the first rail 121A. For example, the curvature of the first surface 121AL of the first rail 121A and the curvature of the third surface S3 of the first wheel 144A may be the same or the curvature of the third surface S3 of the first wheel 144A may be greater/higher than the curvature of the first surface 121AL of the first rail 121A as shown in FIG. 11. The curvature of the first surface 121AL of the first rail 121A and the curvature of the third surface S3 of the first wheel 144A described above and corresponding curvatures of the present disclosure are principal curvatures having maximum values. For example, a curvature of a given point of a surface (e.g., a curved surface) may be defined as a reciprocal of a radius of the given point of the surface (e.g., the curved surface).

Furthermore, the magnets may be included in the first wheel 144A and the first rail 121A such that when the first wheel 144A rolls along the first surface 121AL of the first rail 121A, an attractive force acts between the third magnetic area MR3 as the center area Center of the first rail 121A and the first wheel 144A, while a repulsive force acts between the first wheel 144A and each of the first magnetic area MR1 and the second magnetic area MR2 of the first rail 121A spaced apart from each other while the third magnetic area MR3 is disposed therebetween as shown in FIG. 11. Thus, even when the first wheel 144A is deviated from the center area Center of the first rail 121A, a restoring force toward the center area Center of the first rail 121A may act on the first wheel 144A.

Next, referring to FIG. 13, FIG. 13 shows a trajectory/trace along which the first wheel 144A moves while rolling on the first rail 121A when the first sliding member 141A (shown in FIG. 5) moves on the first rail 121A in the first direction D1. For example, FIG. 13 may show a top portion of the first rail 121A longitudinally extending in the first direction D1. The trajectory/trace along which the first wheel 144A moves on the first rail 121A may be divided into a first section V and a second section VI. As shown in FIG. 13, in the first section V, the first wheel 144A may be deviated from the center area Center of the first rail 121A. At this time, as shown in FIG. 12, the restoring force in the direction toward the center area Center of the first rail 121A acts on the first wheel 144A such that the first wheel 144A stops meandering movement, and may move in a line in the first direction D1 while rolling along the center area Center of the first rail 121A. Accordingly, the wear in the first wheel 144A and/or the first rail 121A at points of contact between the first wheel 144A and the first rail 121A may be prevented from occurring, thereby reducing/preventing particle production.

Next, referring to FIG. 14, FIG. 14 is a diagram illustrating movement of the first sliding member 141A along the first surface 121AL of the first rail 121A. For example, FIG. 14 may show a top portion of the first rail 121A longitudinally extending in the first direction D1 and the first sliding member 141A positioned under the first rail 121A. The first wheel 144A and the second wheel 144B are respectively mounted on both opposing ends of the body 143 of the first sliding member 141A. The magnets may be included in the first wheel 144A, and the second wheel 144B, and the first rail 121A such that the attractive force acts between the third magnetic area MR3 of the first rail 121A and the first wheel 144A, and an attractive force acts between the third magnetic area MR3 of the first rail 121A and the second wheel 144B, as shown in FIG. 11. Thus, due to the attractive force between the first sliding member 141A and the first rail 121A, the first sliding member 141A may move along the first surface 121AL as the lower surface of the first rail 121A.

In this regard, an attractive force acts between each of the first wheel 144A and the second wheel 144B respectively mounted on both opposing ends of the body 143 of the first sliding member 141A and the first rail 121A. Thus, when the first sliding member 141A moves on the first surface 121AL of the first rail 121A, structural stability may be secured.

Accordingly, as shown in FIG. 3, when the second cable 120 (or a portion of the second cable 120) moves in the first direction D1, the first support unit 131 connected to the first sliding member 141A via the first bracket 151A, and connected to the second sliding member 141B via or through the second bracket 151B stably supports the second cable 120 to prevent the second cable 120 from sagging. Likewise, when the second cable 120 moves in the first direction D1, the second support unit 132 connected to the third sliding member 142A via or through the third bracket 152A, and connected to the fourth sliding member 142B via or through the fourth bracket 152B stably supports the second cable 120 together with the first support unit 131, thereby preventing the second cable 120 from sagging.

Even though different figures illustrate variations of exemplary embodiments and different embodiments disclose different features from each other, these figures and embodiments are not necessarily intended to be mutually exclusive from each other. Rather, features depicted in different figures and/or described above in different embodiments can be combined with other features from other figures/embodiments to result in additional variations of embodiments, when taking the figures and related descriptions of embodiments as a whole into consideration. For example, components and/or features of different embodiments described above can be combined with components and/or features of other embodiments interchangeably or additionally to form additional embodiments unless the context clearly indicates otherwise, and the present disclosure includes the additional embodiments.

Although embodiments of the present disclosure have been described with reference to the accompanying drawings, the present disclosure is not limited to the above embodiments, but may be implemented in various different forms. A person skilled in the art may appreciate that the present disclosure may be practiced in other concrete forms without changing the technical spirit or essential characteristics of the present disclosure. Therefore, it should be appreciated that the embodiments as described above is not restrictive but illustrative in all respects.

What is claimed is:

1. A lithography apparatus comprising:
a wafer stage;
a cable connected to the wafer stage;
a first support supporting the cable;
a first rail installed on a first side of the cable, and including a curved track extending in a direction from a lower portion of the cable toward an upper portion of the cable, wherein the first rail includes a concave first surface;
a second rail installed on a second side of the cable opposite the first side of the cable, and including a curved track extending in the direction from the lower portion of the cable toward the upper portion of the cable, wherein the second rail includes a concave second surface;
a first wheel configured to roll along the first surface of the first rail, wherein the first wheel includes a first N pole area and a first S pole area, wherein a surface of the first wheel facing the first surface of the first rail has a curvature;
a second wheel configured to roll along the second surface of the second rail, wherein the second wheel includes a second N pole area and a second S pole area, wherein a surface of the second wheel facing the second surface of the second rail has a curvature;
a first sliding member, wherein the first wheel is mounted on the first sliding member, and is connected to the first support through a first bracket on a side surface of the first sliding member; and
a second sliding member, wherein the second wheel is mounted on the second sliding member and is connected to the first support through a second bracket on a side surface of the second sliding member,
wherein the first surface of the first rail includes:
a first magnetic area;

a second magnetic area spaced apart from the first magnetic area; and
a third magnetic area between the first magnetic area and the second magnetic area,
wherein the third magnetic area includes:
a third S pole area vertically overlapping the first N pole area of the first wheel; and
a third N pole area vertically overlapping the first S pole area of the first wheel,
wherein the second surface of the second rail includes:
a fourth magnetic area;
a fifth magnetic area spaced apart from the fourth magnetic area; and
a sixth magnetic area between the fourth magnetic area and the fifth magnetic area,
wherein the sixth magnetic area includes:
a fourth S pole area vertically overlapping the second N pole area of the second wheel; and
a fourth N pole area vertically overlapping the second S pole area of the second wheel.

2. The lithography apparatus of claim 1, wherein when the first wheel rolls along the first surface of the first rail, the first magnetic area and the second magnetic area are positioned such that a spacing between the first magnetic area and the first N pole area of the first wheel is smaller than a spacing between the second magnetic area and the first N pole area of the first wheel,
wherein the first magnetic area has N-pole magnetism.

3. The lithography apparatus of claim 2, wherein when the first wheel rolls along the first surface of the first rail, the first magnetic area and the second magnetic area are positioned such that a spacing between the second magnetic area and the first S pole area of the first wheel is smaller than a spacing between the first magnetic area and the first S pole area of the first wheel,
wherein the second magnetic area has S-pole magnetism.

4. The lithography apparatus of claim 1, wherein a curvature of the first surface of the first rail is equal to or less than the curvature of the surface of the first wheel facing the first surface of the first rail.

5. The lithography apparatus of claim 4, wherein a curvature of the second surface of the second rail is equal to or less than the curvature of the surface of the second wheel facing the second surface of the second rail.

6. The lithography apparatus of claim 1, wherein the first rail is spaced apart from the first side of the cable by a first spacing,
wherein the second rail is spaced apart from the second side of the cable by a second spacing, wherein the first and second rails are arranged parallel to each other,
wherein the lithography apparatus further comprises:
a third rail spaced apart from the first side of the cable by a third spacing greater than the first spacing;
a fourth rail spaced apart from the second side of the cable by a fourth spacing greater than the second spacing; and
a second support configured to prevent the cable from sagging, wherein when the cable moves, the second support is spaced apart from the first support and supports the cable to maintain a bent state of the cable.

7. The lithography apparatus of claim 6, wherein the third rail includes a curved track extending in a direction from the lower portion of the cable toward the upper portion of the cable and a concave third surface, wherein the fourth rail includes a curved track extending in a direction from the lower portion of the cable toward the upper portion of the cable and a concave fourth surface.

8. The lithography apparatus of claim 7, wherein the third surface includes a seventh magnetic area and an eighth magnetic area having different polarities, and a ninth magnetic area between the seventh magnetic area and the eighth magnetic area.

9. The lithography apparatus of claim 8, wherein the ninth magnetic area includes a fifth N-pole area and a fifth S-pole area, wherein one of the seventh magnetic area and the eighth magnetic area closer to the fifth N-pole area has S-pole magnetism, while the other of the seventh magnetic area and the eighth magnetic area closer to the fifth S-pole area has N-pole magnetism.

10. The lithography apparatus of claim 7, further comprising:

a third sliding member, wherein a third wheel configured to roll along the third surface of the third rail is mounted on the third sliding member; and a fourth sliding member, wherein a fourth wheel configured to roll along the fourth surface of the fourth rail is mounted on the fourth sliding member, wherein the third wheel includes a surface facing the third surface of the third rail and having a curvature equal to or greater than a curvature of the third surface of the third rail, wherein the fourth wheel includes a surface facing the fourth surface of the fourth rail and having a curvature equal to or greater than a curvature of the fourth surface of the fourth rail.

11. The lithography apparatus of claim 10, wherein the third surface of the third rail includes a seventh magnetic area on a center area of the third surface, wherein the seventh magnetic area longitudinally extends in a longitudinal direction of the third rail, wherein the seventh magnetic area includes a fifth N-pole area and a fifth S-pole area arranged side by side and each extending in the longitudinal direction of the third rail, wherein the third wheel includes a sixth N pole area and a sixth S pole area, wherein when the third wheel rolls along the third surface of the third rail, the sixth N pole area contacts the fifth S pole area, and the sixth S pole area contacts the fifth N pole area.

12. The lithography apparatus of claim 11, wherein the third surface of the third rail further includes an eighth magnetic area and a ninth magnetic area spaced apart from each other and each extending in the longitudinal direction of the third rail, wherein the seventh magnetic area is between the eighth magnetic area and the ninth magnetic area, wherein the eighth magnetic area and the ninth magnetic area have different polarities.

13. A lithography apparatus comprising:

a wafer stage;

a cable configured to move while maintaining a bent state thereof as the wafer stage moves;

a first support coupled to the cable and configured to support the cable by moving on the cable as the cable moves;

a first rail disposed on a first side of the cable and including a first track curved along a direction in which the cable is bent;

a second rail disposed on a second side of the cable opposite the first side of the cable and including a second track curved along a direction in which the cable is bent, wherein the first and second rails are arranged parallel to each other;

a first sliding member configured to move along a first surface of the first rail, wherein the first sliding member includes a first body, and a first wheel and a second wheel respectively disposed at both opposing ends of the first body;

a second sliding member configured to move along a second surface of the second rail, wherein the second sliding member includes a second body, and a third wheel and a fourth wheel respectively disposed at both opposing ends of the second body;

a first bracket mounted on a side surface of the first body and connects the first sliding member and the first support to each other; and a second bracket mounted on a side surface of the second body and connects the second sliding member and the first support to each other, wherein the first surface longitudinally extends in a longitudinal direction of the first rail and includes a first magnetic area on a center area of the first surface, wherein the second surface longitudinally extends in a longitudinal direction of the second rail and includes a second magnetic area on a center area of the second surface, wherein each of the first surface and the second surface is concave in an inner area thereof, wherein each of the first to fourth wheels include a convex side surface, wherein the side surface of each of the first to fourth wheels includes a first area and a second area arranged side by side and extending along a circumference of each of the first to fourth wheels, wherein the first area and the second area have different magnetic polarities.

14. The lithography apparatus of claim 13, wherein the side surface of each of the first and second wheels has a shape in which a central portion thereof protrudes from each of both opposing edge portions thereof.

15. The lithography apparatus of claim 14, wherein a curvature of the side surface of each of the first and second wheels is equal to or greater than a curvature of the first surface.

16. The lithography apparatus of claim 13, wherein the first magnetic area includes a first N pole area and a first S pole area longitudinally extending in the longitudinal direction of the first rail and arranged side by side in a direction intersecting the longitudinal direction of the first rail, wherein when each of the first and second wheels rolls along the first rail, the first area of each of the first and second wheels rolls on the first S pole area, while the second area of each of the first and second wheels rolls on the first N pole area, wherein the first area has N-pole magnetism, and the second area has S-pole magnetism.

17. The lithography apparatus of claim 16, wherein the first surface further includes a third magnetic area and a fourth magnetic area longitudinally extending in the longitudinal direction of the first rail and spaced apart from each other, wherein the first magnetic area is disposed between the third magnetic area and the fourth magnetic area,

wherein the third magnetic area is disposed adjacent to the first N pole area, and the fourth magnetic area is disposed adjacent to the first S pole area, wherein the third magnetic area has S-pole magnetism, and the fourth magnetic area has N-pole magnetism.

18. A lithography apparatus comprising:

a wafer stage;

a first cable connected to the wafer stage and configured to be bent as the wafer stage moves in a first direction;

a second cable disposed under the first cable and configured to be bent as the wafer stage moves in a second direction intersecting the first direction;

a first support supporting the second cable and configured to prevent the second cable from sagging;

a first rail disposed on a first side of the second cable and including a first track curved along a direction in which the second cable is bent, wherein the first rail includes a concave first surface;

a second rail disposed on a second side of the second cable opposite the first side of the second cable and including a second track curved along a direction in which the second cable is bent, wherein the first and second rails are arranged in parallel with each other, wherein the second rail includes a concave second surface, a first sliding member configured to move along the first surface of the first rail, wherein the first sliding member includes a first body, and a first wheel and a second wheel respectively disposed at both opposing ends of the first body, wherein each of the first wheel and the second wheel includes a convex surface facing the first surface of the first rail, wherein the first sliding member further includes a first bracket connecting the first body and the first support to each other; and a second sliding member configured to move along the second surface of the second rail, wherein the second sliding member includes a second body, and a third wheel and a fourth wheel respectively disposed at both opposing ends of the second body, wherein each of the third wheel and the fourth wheel includes a convex surface facing the second surface of the second rail, wherein the second sliding member further includes a second bracket connecting the second body and the first support to each other, wherein the first surface includes a first N pole area and a first S pole area longitudinally extending in a longitudinal direction of the first rail, and arranged side by side in a center area of the first surface, wherein the second surface includes a second N pole area and a second S pole area longitudinally extending in a longitudinal direction of the second rail, and arranged side by side in a center area of the second surface, wherein each of the first to fourth wheels includes a first area and a second area extending along a circumference thereof and arranged side by side, wherein the first area and the second area have different magnetic polarities, wherein when each of the first and second wheels rolls along the first surface of the first rail, the first area of each of the first and second wheels contacts the first S pole area, and the second area of each of the first and second wheels contacts the first N pole area, wherein when each of the third and fourth wheels rolls along the second surface of the second rail, the first area of each of the third and fourth wheels contacts the second S pole area, and the second area of each of the third and fourth wheels contacts the second N pole area,

24 wherein the first area has N-pole magnetism, and the second area has S-pole magnetism.

19. The lithography apparatus of claim 18, further comprising:

a second support spaced apart from the first support and configured to prevent the second cable from sagging when the second cable moves in the second direction;

a third rail disposed on the first side of the second cable and including a third track curved along a direction in which the second cable is bent, wherein the third rail includes a concave third surface;

a fourth rail disposed on a second side of the second cable opposite the first side of the second cable and including a fourth track curved along the direction in which the second cable is bent, wherein the third and fourth rails are arranged side by side, wherein the fourth rail includes a concave fourth surface;

a third sliding member configured to move along the third surface of the third rail, wherein the third sliding member includes a third body, and fifth and sixth wheels respectively disposed at both opposing ends of the third body, wherein each of the fifth and sixth wheels includes a convex surface facing the third surface of the third rail, wherein the third sliding member further includes a third bracket connecting the third body and the second support to each other; and a fourth sliding member configured to move along the fourth surface of the fourth rail, wherein the fourth sliding member includes a fourth body, and a seventh wheel and an eighth wheel respectively disposed at both opposing ends of the fourth body, wherein each of the seventh wheel and the eighth wheel includes a convex surface facing the fourth surface of the fourth rail, wherein the fourth sliding member further includes a fourth bracket connecting the fourth body and the second support to each other, wherein the third surface includes a third N pole area and a third S pole area longitudinally extending in a longitudinal direction of the third rail, and arranged side by side in a center area of the third surface, wherein the fourth surface includes a fourth N pole area and a fourth S pole area longitudinally extending in a longitudinal direction of the fourth rail, and arranged side by side in a center area of the fourth surface, wherein each of the fifth to eighth wheels includes a third area and a fourth area arranged side by side and extending along a circumference thereof, wherein the third area and the fourth area have different magnetic polarities, wherein when each of the fifth and sixth wheels rolls along the third surface of the third rail, the third area of each of the fifth and sixth wheels contacts the third S pole area, and the fourth area of each of the fifth and sixth wheels contacts the third N pole area, wherein when each of the seventh and eighth wheels rolls along the fourth surface of the fourth rail, the third area of each of the seventh and eighth wheels contacts the fourth S pole area, and the fourth area of each of the seventh and eighth wheels contacts the fourth N pole area, wherein the third area has N-pole magnetism, and the fourth area has S-pole magnetism.

20. The lithography apparatus of claim 18, wherein the first surface further includes a first magnetic area and a second magnetic area longitudinally extending in the longitudinal direction of the first rail, and spaced apart from each other, wherein the first N pole area and the first S pole area are disposed between the first magnetic area and the second magnetic area, wherein the first magnetic area is disposed adjacent to the first N pole area, and the second magnetic area is disposed adjacent to the first S pole area, wherein the first magnetic area has S-pole magnetism, and the second magnetic area has N-pole magnetism.

* * * * *